US008629425B2

(12) United States Patent
Soh et al.

(10) Patent No.: US 8,629,425 B2
(45) Date of Patent: Jan. 14, 2014

(54) TUNABLE WAVELENGTH LIGHT EMITTING DIODE

(75) Inventors: Chew Beng Soh, Singapore (SG); Soo Jin Chua, Singapore (SG); Haryono Hartono, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 6 days.

(21) Appl. No.: 12/440,330

(22) PCT Filed: Sep. 8, 2006

(86) PCT No.: PCT/SG2006/000263
§ 371 (c)(1),
(2), (4) Date: Jun. 25, 2009

(87) PCT Pub. No.: WO2008/030183
PCT Pub. Date: Mar. 13, 2008

(65) Prior Publication Data
US 2010/0025653 A1     Feb. 4, 2010

(51) Int. Cl.
*H01L 31/00*     (2006.01)
(52) U.S. Cl.
USPC .......... 257/14; 257/13; 257/28; 257/E33.008; 438/22; 438/23; 438/46; 438/47
(58) Field of Classification Search
USPC ................. 257/13, 89, 28, 79, 458, 461, 437, 257/E33.008; 438/22–32, 38, 46–47
See application file for complete search history.

(56) References Cited

U.S. PATENT DOCUMENTS

| 6,235,414 | B1 | 5/2001 | Epstein et al. | |
| 6,927,426 | B2 | 8/2005 | Matsuoka et al. | |
| 7,279,716 | B2 | 10/2007 | Chen | |
| 8,044,414 | B2 | 10/2011 | Hori et al. | |
| 2003/0127660 | A1 | 7/2003 | Bawendi et al. | |
| 2004/0023427 | A1 | 2/2004 | Chua et al. | |
| 2004/0147824 | A1* | 7/2004 | Diab et al. | 600/323 |

(Continued)

FOREIGN PATENT DOCUMENTS

| JP | 2004095724 A | 3/2004 |
| JP | 2005-294510 | * 10/2005 |

(Continued)

OTHER PUBLICATIONS

Kim et al., "Fabrication and Characterization of InGaN Nano-scale Dots for Blue and Green LED Applications" Materials Research Society Symposium Proceedings, Materials Research Society, USA, vol. 595, Nov. 1, 1999, pp. F99W11.74/1-5 (XP009137755).

(Continued)

*Primary Examiner* — Mark A Laurenzi
(74) *Attorney, Agent, or Firm* — Volpe and Koenig, P.C.

(57) ABSTRACT

A light emitting diode and a method of fabricating a light emitting diode, the diode has a first set of multiple quantum wells (MQWs), each of the MQWs of the first set comprising a wetting layer providing nucleation sites for quantum dots (QDs) or QD-like structures in a well layer of said each MQW; and a second set of MQWs, each of the MQWs of the second set formed so as to exhibit a photoluminescence (PL) peak wavelength shifted compared to the MQWs of the first set.

27 Claims, 14 Drawing Sheets

(56) References Cited

U.S. PATENT DOCUMENTS

| | | |
|---|---|---|
| 2004/0168626 A1* | 9/2004 | Moeck et al. .................. 117/84 |
| 2005/0082543 A1 | 4/2005 | Alizadeh et al. |
| 2005/0230693 A1 | 10/2005 | Chen |
| 2006/0049415 A1 | 3/2006 | Liao et al. |
| 2006/0181203 A1 | 8/2006 | Meng et al. |
| 2007/0007541 A1 | 1/2007 | Kim et al. |
| 2009/0206320 A1 | 8/2009 | Chua et al. |

FOREIGN PATENT DOCUMENTS

| | | |
|---|---|---|
| JP | 2005303320 A | 10/2005 |
| JP | 2007019455 A | 1/2007 |
| JP | 2008535215 A | 8/2008 |
| JP | 2009505377 A | 2/2009 |
| WO | 2006101452 | 9/2006 |

OTHER PUBLICATIONS

Adelmann et al. "Self-assembled InGaN quantum dots grown by molecular-beam epitaxy" Applied Physics Letters, vol. 76, No. 12, Mar. 20, 2000 (pp. 1570-1572).

B. Damilano et al. "Room-temperature blue-green emission from InGaN/GaN quantum dots made by strain-induced islanding growth" Applied Physics Letters, vol. 75, No. 24, Dec. 13, 1999 (pp. 3751-3753).

Kim et al, Nano-Scale (Dot)-Induced Optical Emission in InGaN Quantum Wells, Journal of the Korean Physical Society, Jul. 2000, pp. 141-146, vol. 39(1), The Korean Physical Society, Seoul, Korea.

* cited by examiner

US 8,629,425 B2

TUNABLE WAVELENGTH LIGHT EMITTING DIODE

FIELD OF INVENTION

The present invention relates broadly to a light emitting diode and to a method of fabricating a light emitting diode.

BACKGROUND

Light emitting diode (LEDs) have been used in many applications such as outdoor full colour displays, traffic lights, data storage, solid state lighting and communications. Presently, LEDs can only emit light at a particular wavelength. White LEDs are made up of three separate LEDs emitting light with the three primary colours of blue, green and red. Conventional diodes are made from inorganic compound semiconductors, typically AlGaAs (red), AlInGaP (orange-yellow-green) and InGaN (green-blue). These diodes emit monochromatic light of a frequency corresponding to the bandgap of the compound semiconductor. The difference in the degradation time of these different materials can cause the problem in the extent of white obtained over time. This also applies for the phosphor-based white LEDs, where the different rates of deterioration of the phosphors makes the lifetime for which the device can generate white light shorter than the lifetime of the devices itself. An additional problem with this approach include a low emission efficiency, stock losses and complex packaging as a phosphor layer has to be incorporated into the devices, which leads to a non-reliability of the LEDs. In full color displays, LEDs are used in backlighting and it is essential that the LEDs emit light with a constant ratio of intensity for the respective component wavelengths.

In phosphor based LEDs, phosphor coating can be used to convert blue LEDs to light over a wider spectrum, typically yellow. The combination of yellow and blue light enables the emission of white light. Alternatively, a multi-phosphor blend can be used to generate light such as trichromatic red-green-blue (RGB). However, the extent of the yellow, green or cyan is not tunable as the phosphor can emit light only at a particular wavelength. Furthermore, the approach is expensive and complex since each of the blue, green and red LEDs has to be addressed independently and a feedback is needed.

Amongst LEDs, group III-nitride based LEDs have attracted considerable interest in the field of optoelectronics as their bandgap varies and cover a wide range of emission spectra from ultraviolet to infra-red utilising binary and ternary alloys e.g. AlN, $Al_xGa_{1-x}N$, $In_yGa_{1-y}N$ and InN. InGaN/GaN multiple quantum wells (MQWs) are often employed in the active regions of the group III-nitride based LEDs and laser diodes (LDs). However, the epitaxial growth of InGaN/GaN MQWs poses a great challenge, especially when high In content has to be incorporated for long wavelength applications such as green or red LEDs. Furthermore, the light output efficiency tends to be lowered for light emission with increasing wavelength or higher In incorporation. Lowering the growth temperature results in the increase in the incorporation of In but a reduction in the Photoluminescence (PL) intensity as the crystalline quality is degraded.

Recently, Indium quantum dots have been explored by Chua et al. [Soo Jin Chua et al. US 2004/0023427 A1, Pub Date: Feb. 5, 2004] to achieve a red-shift in the PL emission. Indium Nitride (InN) and Indium-rich Indium Gallium Nitride (InGaN) quantum dots embedded in a single and in multiple $I_xGa_{1-x}N/In_yGa_{1-y}N$ quantum wells (QWs) were formed by using trimethylIndium (TMIn) as antisurfactant during MOCVD growth, and the photoluminescence wavelength has been shifted from 480 to 530 nm [J. Zhang et. al. Appl. Phys. Lett. v80, p 485-487, 2002]. However, the growth of the LEDs using such a technique gives only green emission from the MQWs. There is currently no possibility of getting a red emission from InGaN/GaN MQWs. Perez-Solorzano and co-workers [Perez-Solorzano et al. Appl. Phys. Lett. v87, p 163121-1, 2005] have reported on near-red emission from site controlled pyramidal InGaN quantum dots (QDs), however there is no report on a GaN based LED giving red emission. Practical visible red-orange and yellow light sources have been achieved using AlInGaP, while bright green, blue and violet LEDs are fabricated from GaN based material system. However, even though these diodes, when added together, give a full color display with sufficient brightness, there is no single MQW structure which can emit light with tunable wavelength.

US Patent application publication US 2005/0082543 discloses fabrication of low defect nanostructures of wide bandgap materials and optoelectronics devices. A nanolithographically-defined template is utilised for formation of nanostructures of wide bandgap materials and has been used for fabrication of phosphor-less monolithic white light emitting diodes. The fabrication involves the tuning of the size of the QDs to generate light of different wavelengths. White light is collectively generated by mixing of QDs sized to generate 30% red light, 59% green light and 11% blue light. The nano-pattern substrate includes the use of $SiO_2$ or other pattern masks using lithography techniques. Thus, the fabrication requires a special template to generate the formation of the QDS pattern to give the different colour emission, which increases the complexity and cost of the resulting LEDs.

US Patent application publication US 2003/127660 A1 discloses an electronic device which comprises of QDs embedded in a host matrix and a primary light source which causes the dots to emit secondary light of a selected colour. The host matrix consists of a solid transparent prepolymer colloid and the quantum dots of varying size distribution. The quantum dot consists of materials such as ZnS ZnSe, CdSe and CdS. A solid state light source, for instance, is used to illuminate the dots causing them to photoluminescence light of a colour characteristic of their size distribution. The light may be pure colour (corresponding to a monodisperse size distribution of quantum dots) or mixed colour (corresponding to a polydisperse size distribution of quantum dots). However, again the fabrication requires a special "template", here a host matrix of polymer. Furthermore, the fabrication requires the implementation of QDs which use foreign materials, which may quench the luminescence. Thus, this fabrication technique is complex and thus increases cost of the LEDs, with potentially quenched luminescence.

A need therefore exist to provide a light emitting device that seeks to address at least one of the above problems.

SUMMARY

In accordance with a first aspect of the present invention there is provided a light emitting diode comprising a first set of multiple quantum wells (MQWs), each of the MQWs of the first set comprising a wetting layer providing nucleation sites for quantum dots (QDs) or QD-like structures in a well layer of said each MQW; and a second set of MQWs, each of the MQWs of the second set formed so as to exhibit a photoluminescence (PL) peak wavelength shifted compared to the MQWs of the first set.

The QDs or QD-like structures may comprise In atoms.

The first set of MQWs may comprise about 3 to 5 MQWs.

The second set of MQWs may comprise about 2 to 5 MQWs.

Each of the MQWs of the second set may comprise a Ga-based barrier layer and an Ga-based well layer formed on the Ga-based barrier layer.

Each of the MQWs of the first set may comprise a Ga-based barrier layer, an InGa-based wetting layer formed on the Ga-based barrier layer, and a Ga-based well layer formed on the InGa-wetting layer.

The first set of MQWs may be formed on an n-type doped Ga-based layer, the second set of MQWs is formed on the first set of MQWs, a Ga-based capped layer is formed on the second set of MQWs, and a p-type doped Ga-based layer is formed on the Ga-based capped layer.

The light emitting diode may further comprise electrical contacts for contacting the n-type doped Ga-based layer and the p-type doped Ga-based layer respectively.

The first and second sets of MQWs may be supported on a substrate.

The MQWs may comprise one material system of a group consisting of InGa/Ga, InGa/AlGa, Ga/AlGa and InGa/AlInGa.

The MQWs may comprise the nitride or phosphide of the material system.

A combined PL spectrum of the diode may cover a tunable wavelength range of about 400-800 nm.

In accordance with a second aspect of the present invention there is provided a method of fabricating a light emitting diode, the method comprising the steps of forming a first set of multiple quantum wells (MQWs), each of the MQWs of the first set comprising a wetting layer providing nucleation sites for quantum dots (QDs) or QD-like structures in a well layer of said each MQW; and forming a second set of MQWs, each of the MQWs of the second set formed so as to exhibit a photoluminescence (PL) peak wavelength shifted compared to the MQWs of the first set.

The QDs or QD-like structures may comprise In atoms.

The first set of MQWs may comprise about 3 to 5 MQWs.

The second set of MQWs may comprise about 2 to 5 MQWs.

Each of the MQWs of the second set may comprise a Ga-based barrier layer and an InGa-based well layer formed on the Ga-based barrier layer.

Each of the MQWs of the first set may comprise a Ga-based barrier layer, an InGa-based wetting layer formed on the Ga-based barrier layer, and a Ga-based well layer formed on the InGa-wetting layer.

The first set of MQWs may be formed on an n-type doped Ga-based layer, the second set of MQWs is formed on the first set of MQWs, a Ga-based capped layer is formed on the second set of MQWs, and a p-type doped Ga-based layer is formed on the Ga-based capped layer.

The method may further comprise forming electrical contacts for contacting the n-type doped Ga-based layer and the p-type doped Ga-based layer respectively.

The first and second sets of MQWs may be supported on a substrate.

The first set of MQWs may be formed at a lower temperature than the second set of MQWs.

The first set of MQWs may be formed with a higher In precursor flow than the second set of MQWs.

The MQWs may comprise one material system of a group consisting of InGa/Ga, InGa/AlGa, Ga/AlGa and InGa/AlInGa.

The MQWs may comprise the nitride or phosphide of the material system.

BRIEF DESCRIPTION OF THE DRAWINGS

Embodiments of the invention will be better understood and readily apparent to one of ordinary skill in the art from the following written description, by way of example only, and in conjunction with the drawings, in which.

DETAILED DESCRIPTION

Figure 1:
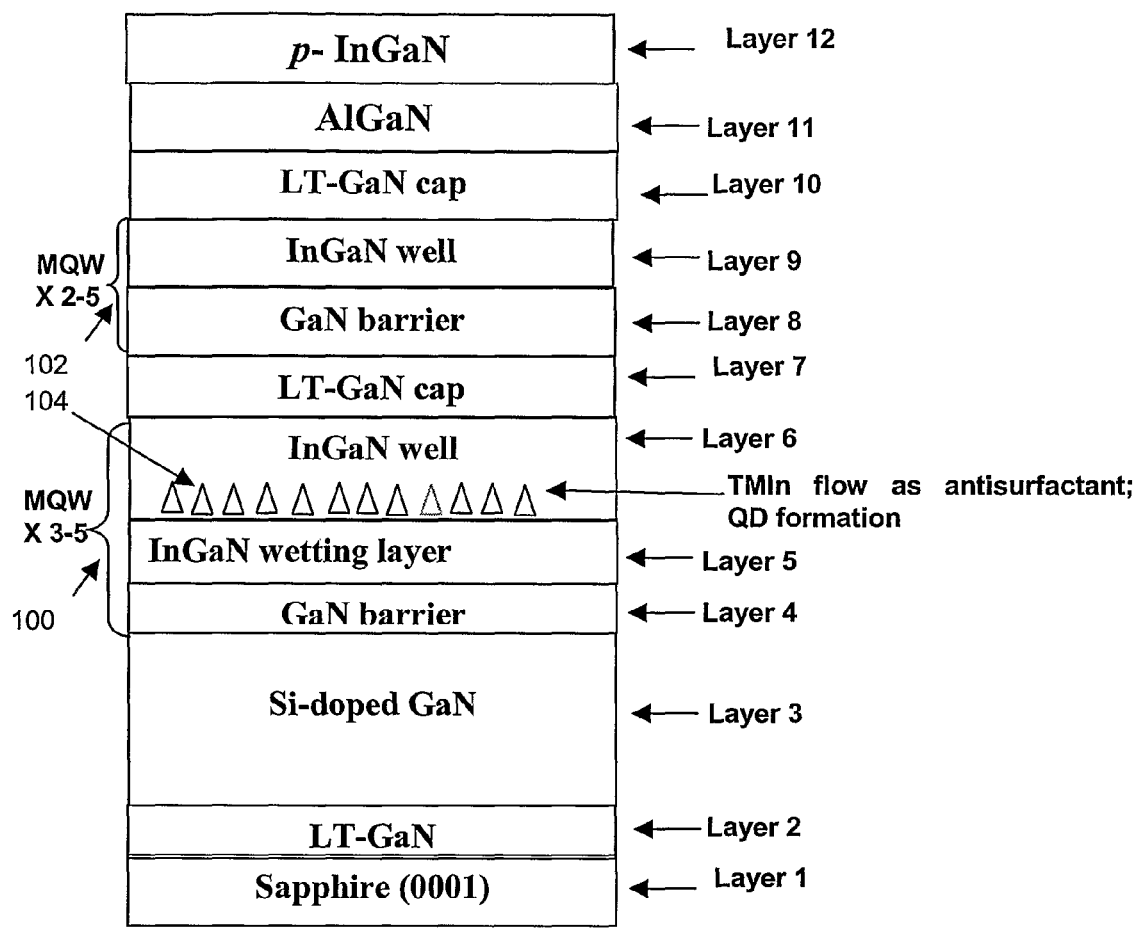
FIG. 1 shows a schematic cross-sectional view of the sample structure of an LED according to an embodiment.

The growth of the LEDs in the example embodiments was performed using a metalorganic chemical vapour deposition (MOCVD) system. Trimethylgallium (TMGa), Trimethlyindium (TMin), Trimethylaluminium (TMA), Magnesium ($Cp_2Mg$) and silane ($SiH_4$) were used as the precursors. Hydrogen and nitrogen were used as the carrier gas for effective incorporation of the elements.

In the LEDs, two sets of MQWs (compare 100, 102 in FIG. 1) were grown at different temperatures so as to obtain emissions at different wavelengths. After a high temperature GaN layer (compare layer 3 in FIG. 1), grown on a low temperature GaN buffer (compare layer 2 in FIG. 1) on e.g. a sapphire substrate (compare layer 1 of FIG. 1), the temperature in the MOCVD chamber is lowered to about 700-750° C. to grow a first set of MQWs consisting of about 3 to 5 wells. A GaN barrier (compare layer 4 in FIG. 1) is first grown to a thickness of about 5.0-10.0 nm with Si doping, $n_s$ about $2.0 \times 10^{17} cm^{-3}$. A thin wetting layer (compare layer 5 in FIG. 1) of $In_xGa_{1-x}N$ with composition of x about 0.10-0.20 and thickness of about 1 nm is grown to enhance the incorporation of the Indium Nitride rich QDs during the In burst process. The In atoms from the Indium precursor segregate at the dangling bonds of the wetting layer of InGaN to serve as a seed layer for the subsequent growth of the InGaN QDs and well layer (compare layer 6 in FIG. 1) as determined by the precursor flow rate. The amount of TMIn acting as antisurfactants and the duration of the TMIn flow are important for the growth of the Indium rich QDs. It was found that too small a flow may not form enough seeds for growth of the QDs, but too long a duration may causes well layer roughening.

After the growth of the first set of MQWs, an about 10-30 nm undoped GaN layer (compare layer 7 in FIG. 1) is grown at about 720-750° C. before the temperature is increased by another about 30° C. for the growth of the second set of MQWs. A n-type GaN barrier (compare layer 8 in FIG. 1) is grown to a thickness of about 5.0-10.0 nm and the InGaN (compare layer 9 in FIG. 1) well is grown to a thickness of about 2.0-5.0 nm. The TMIn flow during the growth of the second set of MQWs is lowered to about 300 sccm or 43.0 µmol/min based on the vapour pressure and the temperature of the TMI source. It was found that the lower TMI flow rate gives a blue-shift in PL emission. The $2^{nd}$ set of MQWs consists of about 2 to 5 wells.

After the growth of the $2^{nd}$ set of MQWs, a thin capped layer (compare layer 10 in FIG. 1) of GaN is grown to a thickness of about 15-30 nm at about 780-800° C. Next, a layer of $Al_aGa_{1-a}N$ (compare layer 11 in FIG. 1) of thickness 20-40 nm is grown, where a is between about 0.1-0.3. This is followed by a p-type InGaN layer (compare layer 12 in FIG. 1) grown to a thickness of about 150-300 nm. Magnesium is used as the p-dopant and growth in the chamber is carried out at about 750-800° C. The TMIn flow rate is set in the range of about 80-150 sccm with a pressure less than about 300 Torr. The pressure is subsequently lowered to about 50-300 Torr for the growth of a thin epilayer of Mg-doped GaN in hydrogen ambient. This was found to improve on the contact resistance. In order to prevent the out-diffusion of the In-rich InGaN nanostructure in the well layer (compare layer 6 of FIG. 1) of the first set of MQWs, a conventional p-type GaN is doped with Indium and the growth of the p-type InGaN (compare layer 12 in FIG. 1) is kept in the range of about 750-800° C. No additional in-situ annealing is carried out to activate the Mg in the p-type InGaN (compare layer 12 in FIG. 1).

FIG. 1 shows a schematic cross-sectional view of the dual set of InGaN/GaN MQWs 100, 102 structure of the example embodiment. Layer 1 is the substrate which can be sapphire, Silicon carbide (SiC), zinc oxide (ZnO) or other substrate. Layer 2 is the low temperature GaN buffer grown at 500-550° C. with a thickness of about 25 nm to facilitate the nucleation of GaN on the sapphire substrate. Layer 3 is the Si-doped high temperature GaN layer grown at around 1000-1050° C., doped to a concentration of about $2\times10^{17}$ to $9\times10^{18}$ cm$^{-3}$. Layer 4 to Layer 6 is the first set of MQWs. Layer 4 is the Si-doped GaN barrier with a doping concentration of about $2\times10^{17}$ to $2\times10^{18}$ cm$^{-3}$. Layer 5 is the wetting layer of $In_xGa_{1-x}N$ pre-growth before TMIn burst. The Indium content, x, ranges from about 0.1 to 0.2. After the growth of layer 5, TMIn and ammonia were flowed to form the seeds for the growth of Indium rich QDs before layer 6 is deposited. The flow rate is maintained at about 10-80 µmol/min for duration of about 3 to 12 seconds while the temperature in the chamber is ramped down by about 10° C. during the TMIn flow. Layer 6 is the $In_yGa_{1-y}N$ well layer with the embedded Indium rich nanostructure 104, where y>x. The embedded In rich nanostructure 104 has an Indium content ranging from about 10 to 60% and emits light in the longer wavelength. Layer 7 is an undoped GaN capped layer of about 15-30 nm grown at about 720-750° C. Layers 8-9 represent the $2^{nd}$ set of MQWs, where the temperature has been increased by about 30° C. from that of the $1^{st}$ set of MQWs. The composition of Indium in the $2^{nd}$ set of MQWs, $In_zGa_{1-z}N$, has the mole fractions z<y as compared to the $1^{st}$ set of MQWs with $In_yGa_{1-y}N$. Layer 10 is the thin capped layer of low temperature GaN of about 15-30 nm at about 780-800° C. Layer 11 is a layer of $Al_aGa_{1-a}N$ of thickness 20-40 nm, where a is between about 0.1-0.3. The layer 12 is the Mg doped (p-type) $In_mGa_{1-m}N$ layer where m is between about 0.05-0.1.

Figure 2:
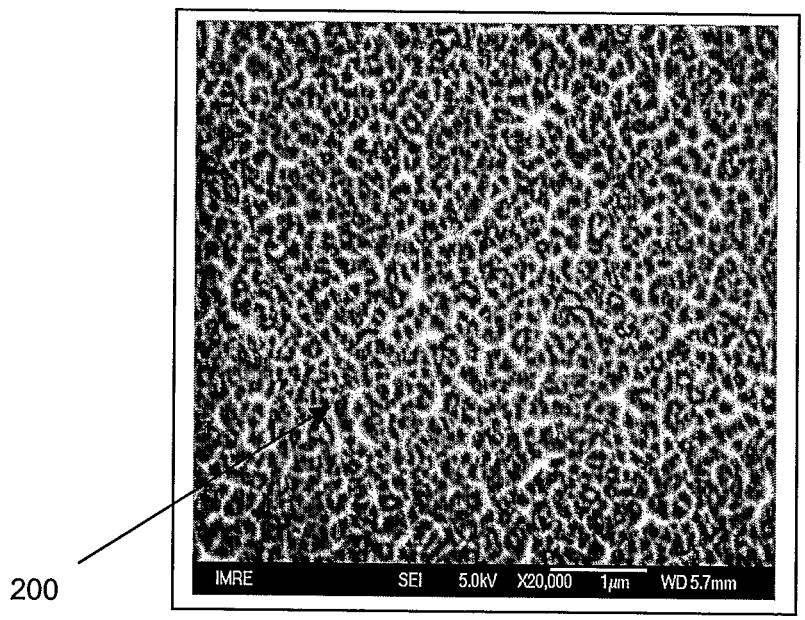
FIG. 2 shows an SEM image of the surface morphology of the p-type InGaN in the LED of FIG. 1.

FIG. 2 shows a scanning electron microscopy (SEM) image of the surface morphology 200 of the p-type InGaN layer 12. The surface morphology 200 appears to be porous.

Processing is then carried out for the Schottky and the ohmic contacts on the p-type InGaN (layer 12, FIG. 1) and the n-type GaN (layer 3, FIG. 1) respectively. A more detailed description of the fabrication process will now be given with reference to FIGS. 3 to 15.

Figure 3:
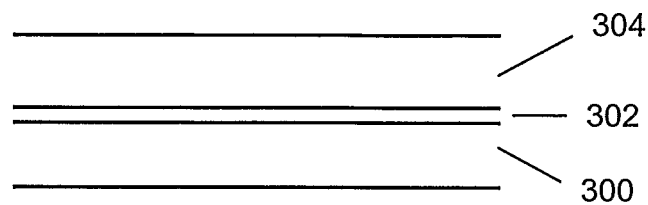
FIGS. 3 to 15 show schematic cross sectional drawings illustrating fabrication of a light emitting device according to an embodiment.

With reference to FIG. 3, the method for fabricating a device that emits lights from red to cyan with varying voltages in one example embodiment comprises providing a substrate 300 with an epilayer 302 of GaN buffer layer and a n-type GaN layer 304. The epilayer 302 consists of the growth of a nucleation (buffer) layer of GaN at about 500-550° C. while the n-type GaN layer 304 is grown at 1000-1050° C.

Figure 4:
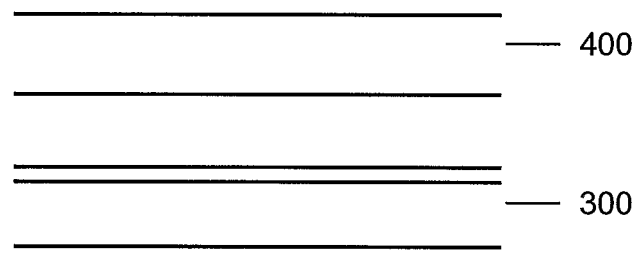
Figure 5:
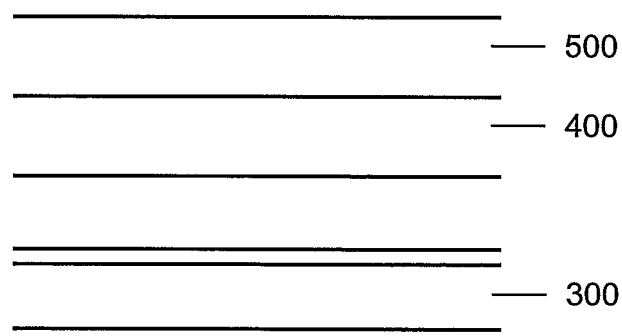

Next, the substrate 300 is maintained at about the same temperature and a layer 400 of Si-doped GaN is deposited with a doping concentration of about $2\times10^{17}$ to $1\times10^{18}$ cm$^{-3}$, as shown in FIG. 4.

Figure 6:
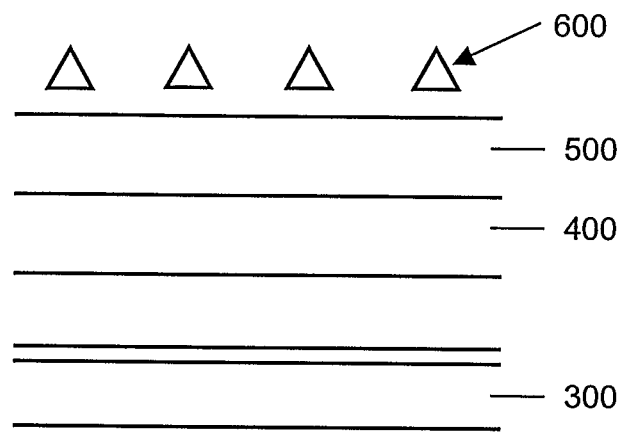

The substrate 300 is then maintained at about the same temperature and a layer 500 of $In_xGa_{1-x}N$, where x ranges from about 0.10 to 0.20, is formed to serve as the wetting layer over the GaN layer 400. With the substrate 300 temperature decreased by about 10° C. and flowing indium-precursor at a flow rate of about 10-80 µmol/min between about 3 to 12 seconds, a quantum dots-like structure 600 of $In_wGa_{1-w}N$, where 0.2<w <1.0, is formed, as shown in FIG. 6.

Figure 7:
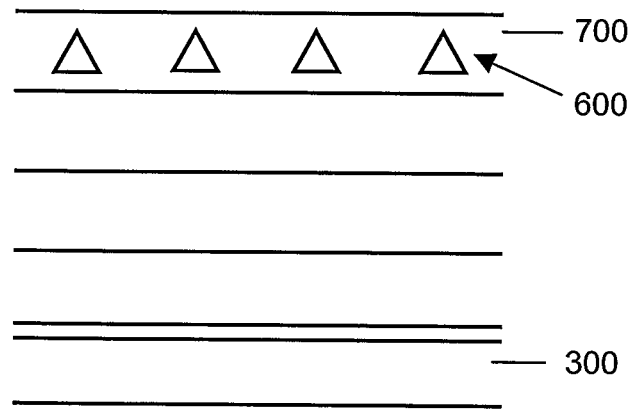
Figure 8:
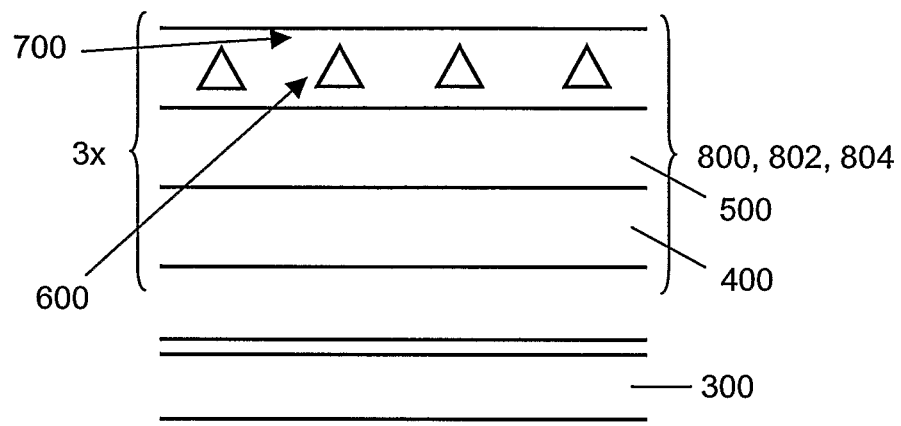

Next, maintaining the substrate 300 at the stable temperature attained in growth of quantum dots-like structure 600 of $In_wGa_{1-w}N$, a well layer 700 of $In_yGa_{1-y}N$, where y>x, is formed, as shown in FIG. 7. The steps described with reference to FIGS. 4 to 7 are repeated three times to form MQWs structures 800, 802, 804 as shown in FIG. 8, where each of the structures 800, 802, 804 comprises a layer 400, a layer 500, a quantum dots-like structure 600 and a well layer 700 (FIGS. 4 to 7).

Figure 9:
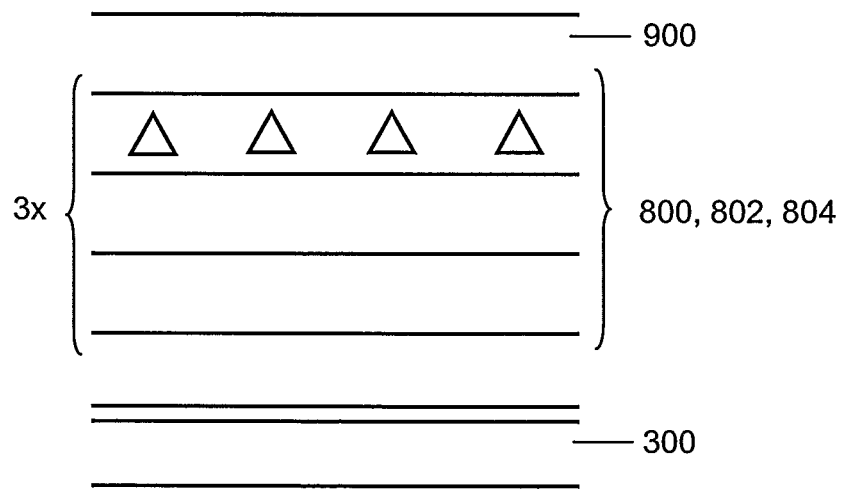
Figure 10:
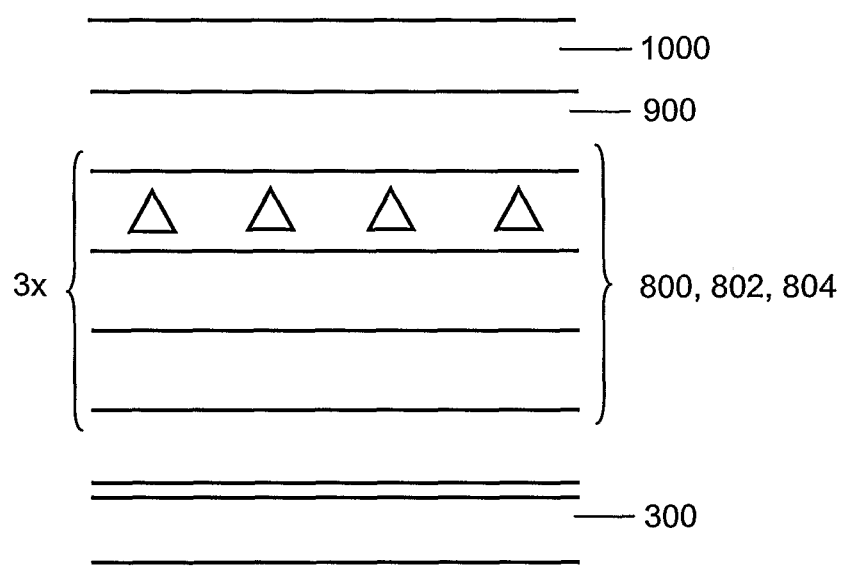
Figure 11:
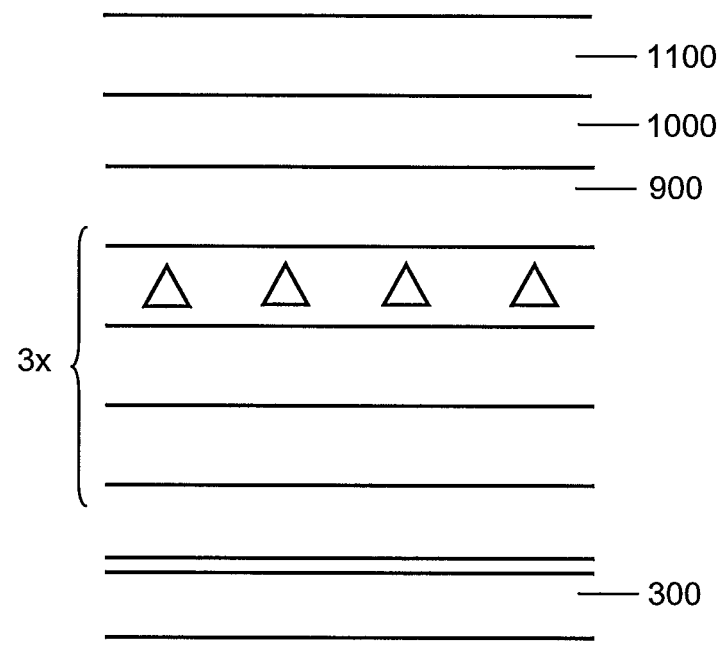
Figure 12:
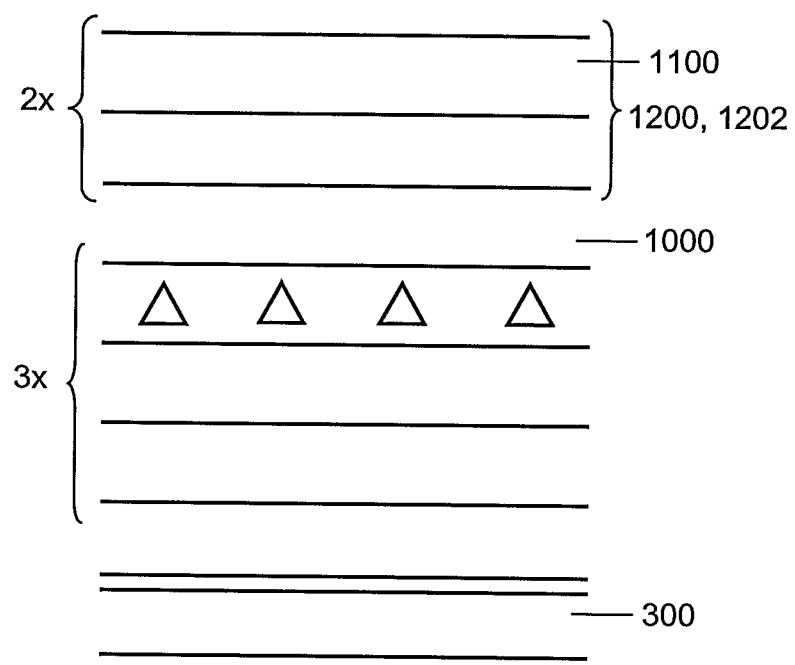

Next, the substrate 300 is maintained at the same temperature as that for the step described above with reference to FIG. 3 of about 700° C. to 850° C. and a capped layer 900 of GaN is deposited, as shown in FIG. 9. The substrate 300 temperature is then increased by 30° C. and a layer 1000 of Si-doped GaN with a doping concentration of about $2\times10^{17}$ to $1\times10^{18}$ cm$^{-3}$ is deposited, as shown in FIG. 10. The substrate is maintained at about the same temperature and a well layer 1100 of $In_zGa_{1-z}N$, where z<y, is formed, as shown in FIG. 11. The steps described with reference to FIGS. 10 and 11 are repeated two times to form MQWs structures 1200, 1202 as shown in FIG. 12. Each of the structures 1200, 1202 comprises a Si-doped GaN layer 1000 and a well layer 1100 (FIGS. 10, 11).

Figure 13:
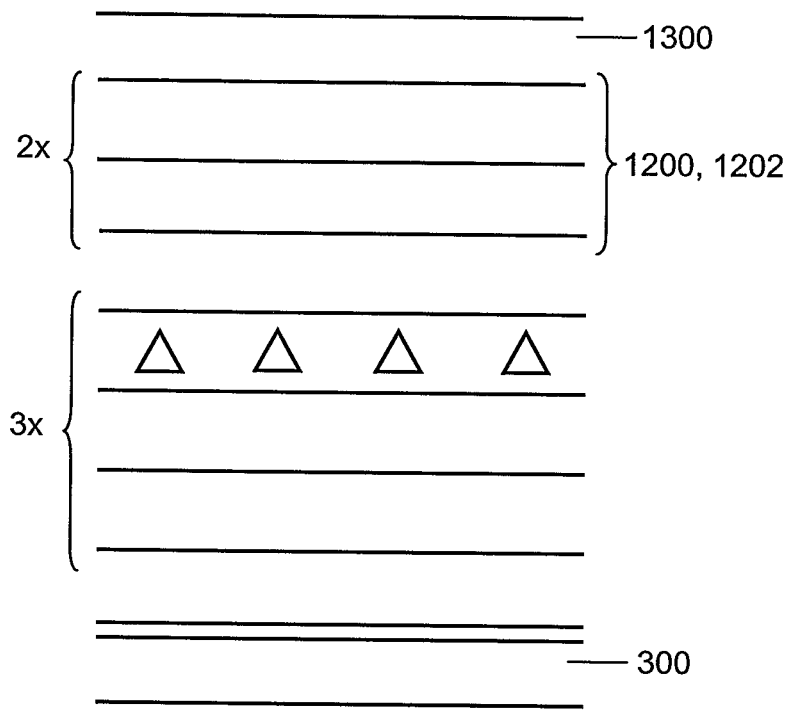
Figure 14:
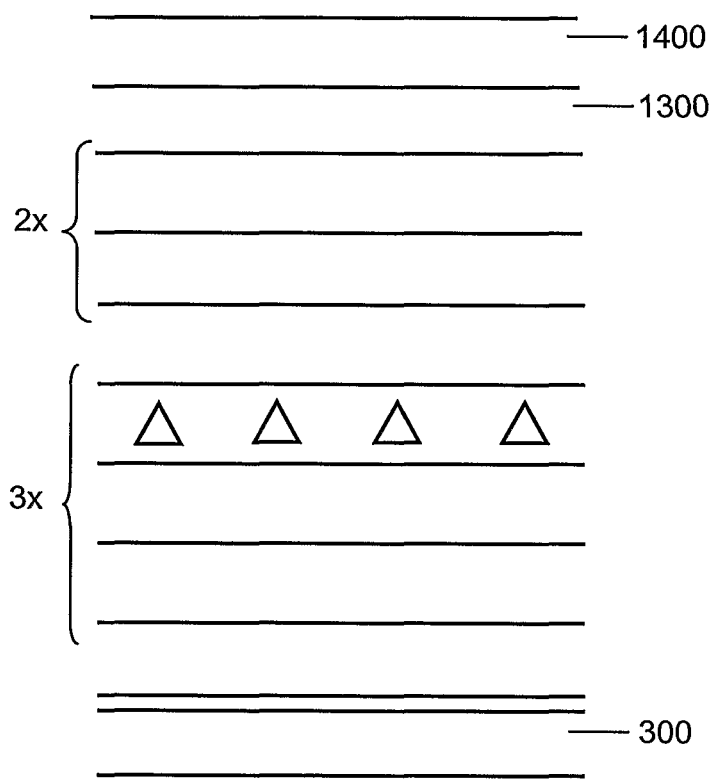
Figure 15:
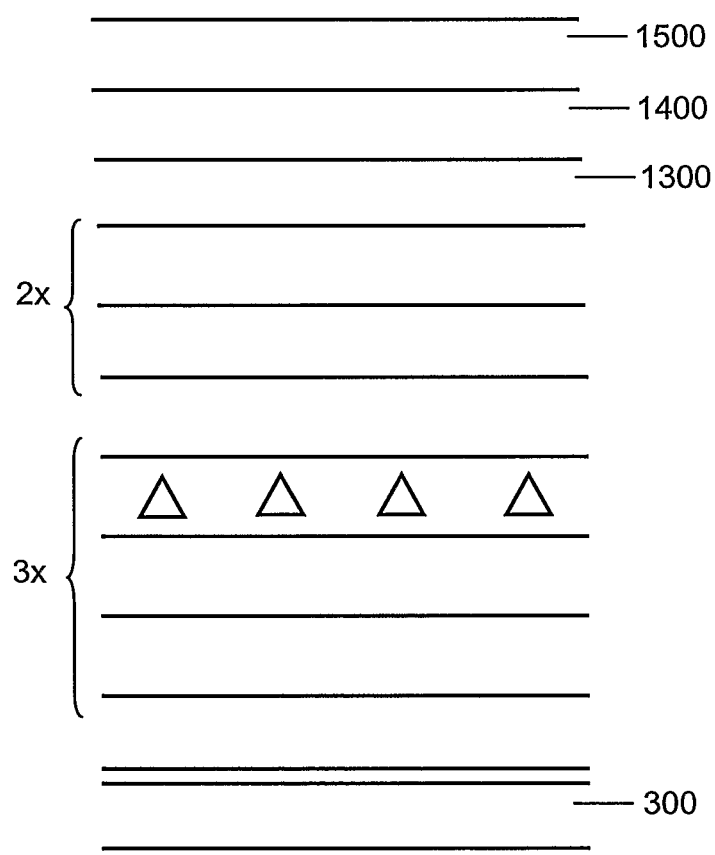

The substrate 300 is maintained at about the same temperature and a capped layer 1300 of Si-doped GaN with a doping concentration of about $2\times10^{17}$ to $1\times10^{18}$ cm$^{-3}$ is deposited, as shown in FIG. 13. The substrate temperature is then increased by about 30° C. and a layer 1400 of $Al_xGa_{1-x}N$ where 0.1<x<0.3 is formed, as shown in FIG. 14. The substrate is maintained at about the same temperature and a capped layer 1500 of p-type $In_mGa_{1-m}N$ with Mg doping of about $1\times10^{18}$ to $1\times10^{19}$ cm$^{-3}$ is deposited, where m is between about 0.05 to 0.10, as shown in FIG. 15.

Processing is then carried out to make the contact for the devices. Etching of mesa is carried out using $BCl_3$ and $Cl_2$ plasma to reach layer 3 of FIG. 1 (layer 304 of FIG. 3) using Inductive Coupled Plasma Etching (ICP). The p-contact to p-type InGaN layer 1500 followed by n-contact to n-type GaN are then deposited.

The described embodiments seek to produce a single GaN-based LED package chip which can give different colour emission by varying the applied voltage. In terms of the quality of the LEDs, the embodiments can overcome the problem of difference in lifetime of the set of LEDs used, especially when applied for white LEDs or in automobile indicator lighting. As the GaN-based LEDs make use of the quantum dots in the quantum well to produce the emission of the desired wavelength, the problem of degradation and difficulty of packaging associated with the use of phosphor to achieve the different colour emissions can be resolved. The embodiment also avoids the use of polychromatic colour mixing devices to achieve the desired emission wavelength since the emission wavelength itself is tunable by varying the voltages applied to the diode.

Figure 16:
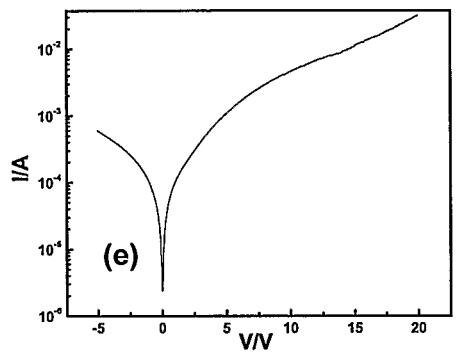
FIG. 16 shows the I-V characteristic of an LED according to an embodiment.
Figure 17:
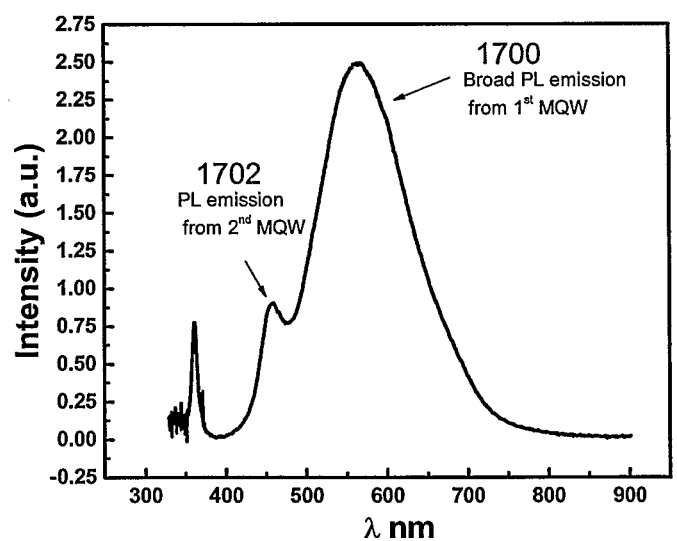
FIG. 17 is a graph showing the dual PL peak emission spectrum from the LED of FIG. 16.
Figure 18:
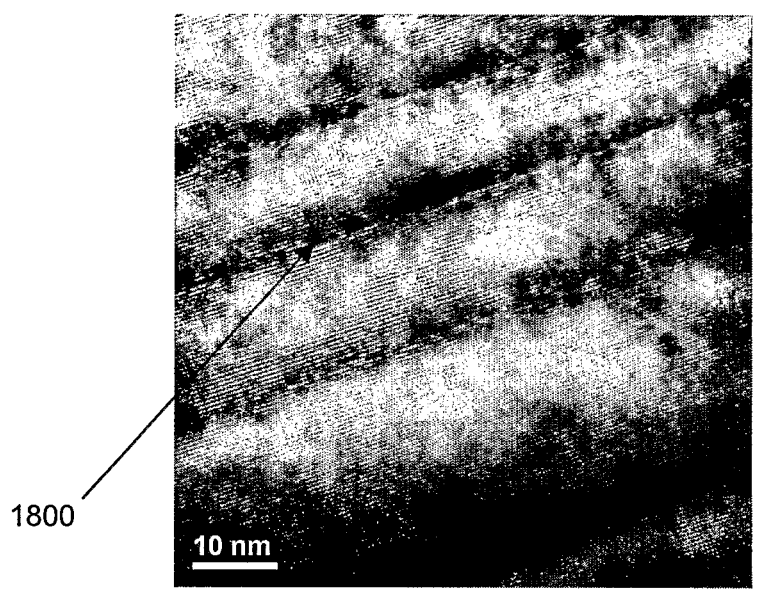
FIG. 18 is a cross-sectional TEM image showing the dual set of MQWs in the LED of FIG. 16.
Figure 19:
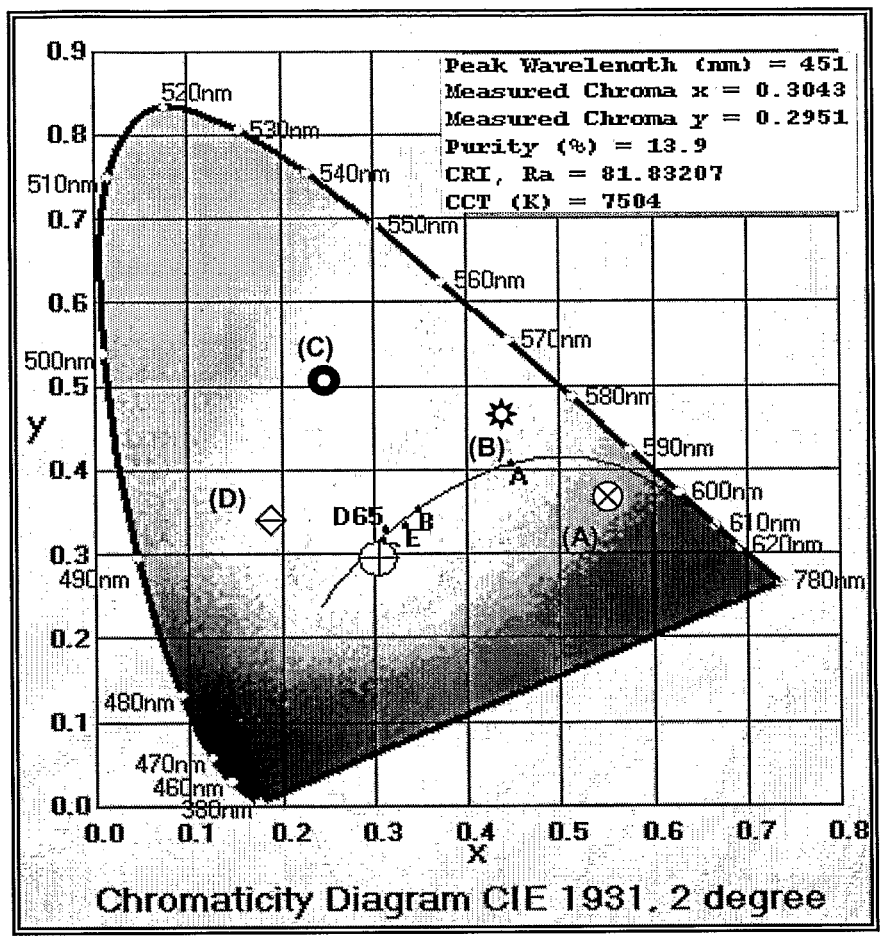
FIG. 19 shows the colour coordinate of the emission at different voltages on the chromaticity Diagram, CIE, for the LED of FIG. 16. The following points correspond to the following voltage range; Point (A) ⊗ : 3-4V, Point (B) ✱ : 5-7V, Point (C) ◯ : 8-10V, Point (D) ⬥ : 11-20V.

FIG. 16 shows the I-V characteristic for one example LED. In that embodiment, In rich InGaN nanostructures are grown on a $In_{0.10}Ga_{0.90}N$ wetting layer using trimethylIndium (TMIn) burst during the growth of InGaN/GaN MQWs. These In rich InGaN nanostructures formed using TMIn as the antisurfactant range from about 50-80 nm, serving as "QDs-like" states in the structure which act as a nucleation site to enhance In incorporation in the InGaN well layer. This gives rise to a broad PL emission peak 1700 with wavelength in the range of 500-700 nm, as shown in FIG. 17. The embedded layer of InGaN nanostructures 1800 can be observed from the transmission electron microscopy (TEM) image in FIG. 18. In order to produce emission with different wavelength, two sets of MQWs are implemented. The $1^{st}$ set of MQWs gives a broad emission band 1700 from about 500-700 nm and $2^{nd}$ set of MQWs enables an emission peak 1702 at 460 nm, as shown in FIG. 17. FIG. 19 shows the colour coordinates of the emission of the LED at different voltages on the chromaticity diagram, CIE (International Commission on Illumination) in particular (a) 3-4V, (b) 5-7V, (c) 8-10V, and (d) 11-20V.

The ability to fabricate LEDs with tunable colours as the voltage is varied is useful for a number of important applications, including:

Illumination and display purposes. This includes the illumination of signboard, displays in shops, houses and the sidewalk.

LCD backlighting, keypad light guides, digital camera flash light, PC monitors backlighting. The use of LEDs, especially the Rainbow LEDs will further enhance the capability of the LEDs to provide colour rendering.

Solid state lighting.

Automobile headlights and traffic lights.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

It is noted that the schematic drawings in FIGS. 1 and 3 to 15 are not to scale. The present invention can also be applied to cover other materials such as the phosphide based emitting devices, which include In/Ga, InGa/AlGa, Ga/AlGa and InGa/AlInGa (well/barrier) system based devices. It will be appreciated that the colors as a function of voltage and the overall wavelength ranges of the devices may vary between different materials. The wetting layer used is dependent on the elements in the well layer. The same ternay or quaternary alloy can be used, for instance an $In_xGa_{1-x}P$ wetting layer is adopted for an $In_yGa_{1-y}P$ well layer, with x<y. The elements to be incorporated for QDs generation are also determined by the elements in the well layer. In atoms are incorporated in the described example as In can give the necessary red shift and a broad spectrum for nitride material. In the case of GaP, the InP QDs used can enhance its emission in the red regime to infra-red.

The invention claimed is:

1. A tunable light emitting diode comprising:
   a first set of multiple quantum wells (MQWs), each of the MQWs of the first set comprising a well layer having quantum dots (QDs) formed therein, and a wetting layer having a different composition than the quantum dots and providing nucleation sites for the QDs in the well layer of said each MQW; and
   a second set of MQWs, each of the MQWs of the second set formed so as to exhibit a photoluminescence (PL) peak wavelength shifted compared to the MQWs of the first set,
   wherein the QDs comprise In atoms, and the first set of MQWs is configured to provide a broad emission band with wavelength at least in the range of 500 nm to 700 nm, and
   wherein the tunable light emitting diode further comprises electrical contacts for receiving an applied voltage to control an output wavelength of the light emitting diode such that the output wavelength of the light emitting diode is tunable by varying the applied voltage.

2. The light emitting diode as claimed in claim 1, wherein the QDs comprise In atoms.

3. The light emitting diode as claimed in claim 1, wherein the first set of MQWs comprises about 3 to 5 MQWs.

4. The light emitting diode as claimed in claim 1, wherein the second set of MQWs comprises about 2 to 5 MQWs.

5. The light emitting diode as claimed in claim 1, wherein each of the MQWs of the second set comprises a Ga-based barrier layer and an Ga-based well layer formed on the Ga-based barrier layer.

6. The light emitting diode as claimed in claim 1, wherein each of the MQWs of the first set comprises a Ga-based barrier layer, an InGa-based wetting layer formed on the Ga-based barrier layer, and a Ga-based well layer formed on the InGa-wetting layer.

7. The light emitting diode as claimed in claim 6, wherein the first set of MQWs are formed on an n-type doped Ga-based layer, the second set of MQWs is formed on the first set of MQWs, a Ga-based capped layer is formed on the second set of MQWs, and a p-type doped Ga-based layer is formed on the Ga-based capped layer.

8. The light emitting diode as claimed in claim 7, further comprising electrical contacts for contacting the n-type doped Ga-based layer and the p-type doped Ga-based layer respectively.

9. The light emitting diode as claimed in claim 1, wherein the first and second sets of MQWs are supported on a substrate.

10. The light emitting diode as claimed in claim 1, wherein the first and second sets of MQWs comprise one material system of a group consisting of InGa/Ga, InGa/AlGa, Ga/AlGa and InGa/AlInGa.

11. The light emitting diode as claimed in claim 10, wherein the MQWs comprise the nitride or phosphide of the material system.

12. The light emitting diode as claimed in claim 1, wherein a combined PL spectrum of the diode covers a tunable wavelength range of about 400-800 nm.

13. A tunable method of fabricating a light emitting diode, the method comprising the steps of:
   forming a first set of multiple quantum wells (MQWs), each of the MQWs of the first set comprising a well layer having quantum dots (QDs) formed therein, and a wetting layer having a different composition than the quantum dots and providing nucleation sites for the QDs in the well layer of said each MQW; and forming a second set of MQWs, each of the MQWs of the second set formed so as to exhibit a photoluminescence (PL) peak wavelength shifted compared to the MQWs of the first set, wherein the QDs comprise In atoms, and the first set of MQWs is configured to provide a broad emission band with wavelength at least in the range of 500 nm to 700 nm, and wherein the tunable light emitting diode further comprises electrical contacts for receiving an applied voltage to control an output wavelength of the light emitting diode such that the output wavelength of the light emitting diode is tunable by varying the applied voltage.

14. The method as claimed in claim 13, wherein the QDs comprise In atoms.

15. The method as claimed in claim 13, wherein the first set of MQWs comprises about 3 to 5 MQWs.

16. The method as claimed in claim 13, wherein the second set of MQWs comprises about 2 to 5 MQWs.

17. The method as claimed in claim 13, wherein each of the MQWs of the second set comprises a Ga-based barrier layer and an InGa-based well layer formed on the Ga-based barrier layer.

18. The method as claimed in claim 13, wherein each of the MQWs of the first set comprises a Ga-based barrier layer, an InGa-based wetting layer formed on the Ga-based barrier layer, and a Ga-based well layer formed on the InGa-wetting layer.

19. The method as claimed in claim 18, wherein the first set of MQWs are formed on an n-type doped Ga-based layer, the second set of MQWs is formed on the first set of MQWs, a Ga-based capped layer is formed on the second set of MQWs, and a p-type doped Ga-based layer is formed on the Ga-based capped layer.

20. The method as claimed in claim 19, further comprising forming electrical contacts for contacting the n-type doped Ga-based layer and the p-type doped Ga-based layer respectively.

21. The method as claimed in claim 13, wherein the first and second sets of MQWs are supported on a substrate.

22. The method as claimed in claim 13, wherein the first set of MQWs is formed at a lower temperature than the second set of MQWs.

23. The method as claimed in claim 13, wherein the first set of MQWs is formed with a higher In precursor flow than the second set of MQWs.

24. The method as claimed in claim 13, wherein the first and second sets of MQWs comprise one material system of a group consisting of InGa/Ga, InGa/AlGa, Ga/AlGa and InGa/AlInGa.

25. The method as claimed in claim 24, wherein the MQWs comprise the nitride or phosphide of the material system.

26. The light emitting diode as claimed in claim 1, wherein the MQWs are formed at a temperature of at least 700°.

27. The method as claimed in claim 13, wherein the MQWs are formed at a temperature of at least 700°.

* * * * *